US005648676A

United States Patent [19]
Iwai et al.

[11] Patent Number: 5,648,676
[45] Date of Patent: Jul. 15, 1997

[54] SEMICONDUCTOR DEVICE WITH PROTECTIVE ELEMENT

[75] Inventors: Takashi Iwai, Hachioji; Motoo Nakano, Yokohama, both of Japan

[73] Assignee: Fujitsu Limited, Kawasaki, Japan

[21] Appl. No.: 591,955

[22] Filed: Jan. 23, 1996

Related U.S. Application Data

[63] Continuation of Ser. No. 312,050, Sep. 23, 1994, abandoned, which is a continuation of Ser. No. 757,184, Sep. 10, 1991, abandoned.

[30] Foreign Application Priority Data

Sep. 10, 1990 [JP] Japan ................................ 2-239350
Mar. 18, 1991 [JP] Japan ................................ 3-052496

[51] Int. Cl.$^6$ ........................................ H01L 29/00
[52] U.S. Cl. .................... 257/500; 257/539; 257/577; 257/591
[58] Field of Search ........................ 257/500, 502, 257/536, 539, 546, 577, 591, 592, 522, 657

[56] References Cited

U.S. PATENT DOCUMENTS

| | | | |
|---|---|---|---|
| 4,089,021 | 5/1978 | Sato et al. | 257/500 |
| 4,535,531 | 8/1985 | Bhatia et al. | 257/592 |
| 4,543,593 | 9/1985 | Fujita | 257/546 |
| 4,847,724 | 7/1989 | Renous | 257/546 |
| 5,151,765 | 9/1992 | Yamauchi | 257/592 |

FOREIGN PATENT DOCUMENTS

| | | |
|---|---|---|
| 0 042 581 | 12/1981 | European Pat. Off. . |
| 0 342 695 | 11/1989 | European Pat. Off. . |
| 52-014384 | 2/1977 | Japan ............ 257/577 |
| 56-149132 | 11/1981 | Japan . |
| 58-003263 | 1/1983 | Japan ............ 257/592 |
| 58-161433 | 9/1983 | Japan . |
| 59-211348 | 11/1984 | Japan . |
| 60-197041 | 10/1985 | Japan . |
| 61-219169 | 9/1986 | Japan . |
| 62-18063 | 1/1987 | Japan . |
| 62-86941 | 4/1987 | Japan . |
| 62-125659 | 6/1987 | Japan . |
| 1-241227 | 9/1989 | Japan . |
| 1-293562 | 11/1989 | Japan ............ 257/592 |
| 2-58499 | 2/1990 | Japan . |
| 2-246633 | 10/1990 | Japan . |

OTHER PUBLICATIONS

*Patent Abstracts of Japan*, vol. 11, No. 187 (E–516) 16 Jun. 1987 & JP–A–62–018063 (NEC Corp) 27 Jan. 1987.
Tailliet et al., "Characterization of an n-p-n Structure under ESD Stress and Proposed Electrical Model," *IEEE Transactions on Electron Devices*, vol. 37, No. 4, Apr. 1990, New York, NY, pp. 1111–1120.

*Primary Examiner*—Sara W. Crane
*Attorney, Agent, or Firm*—Staas & Halsey

[57] ABSTRACT

A semiconductor device has a first-conduction-type semiconductor substrate (19), an internal circuit including a vertical bipolar transistor (18) formed in a second-conduction-type semiconductor layer (20), and a protective element (14). The protective element comprises a first-conduction-type diffusion layer (22a) formed at an upper part of a second-conduction-type semiconductor layer (20a) disposed on the semiconductor substrate (19), and a second-conduction-type diffusion layer (27, 30) formed in the first-conduction-type diffusion layer (22a). The diffusion layer (27, 30) is at least partly deeper than an emitter diffusion layer (23) of the vertical bipolar transistor (18).

12 Claims, 10 Drawing Sheets

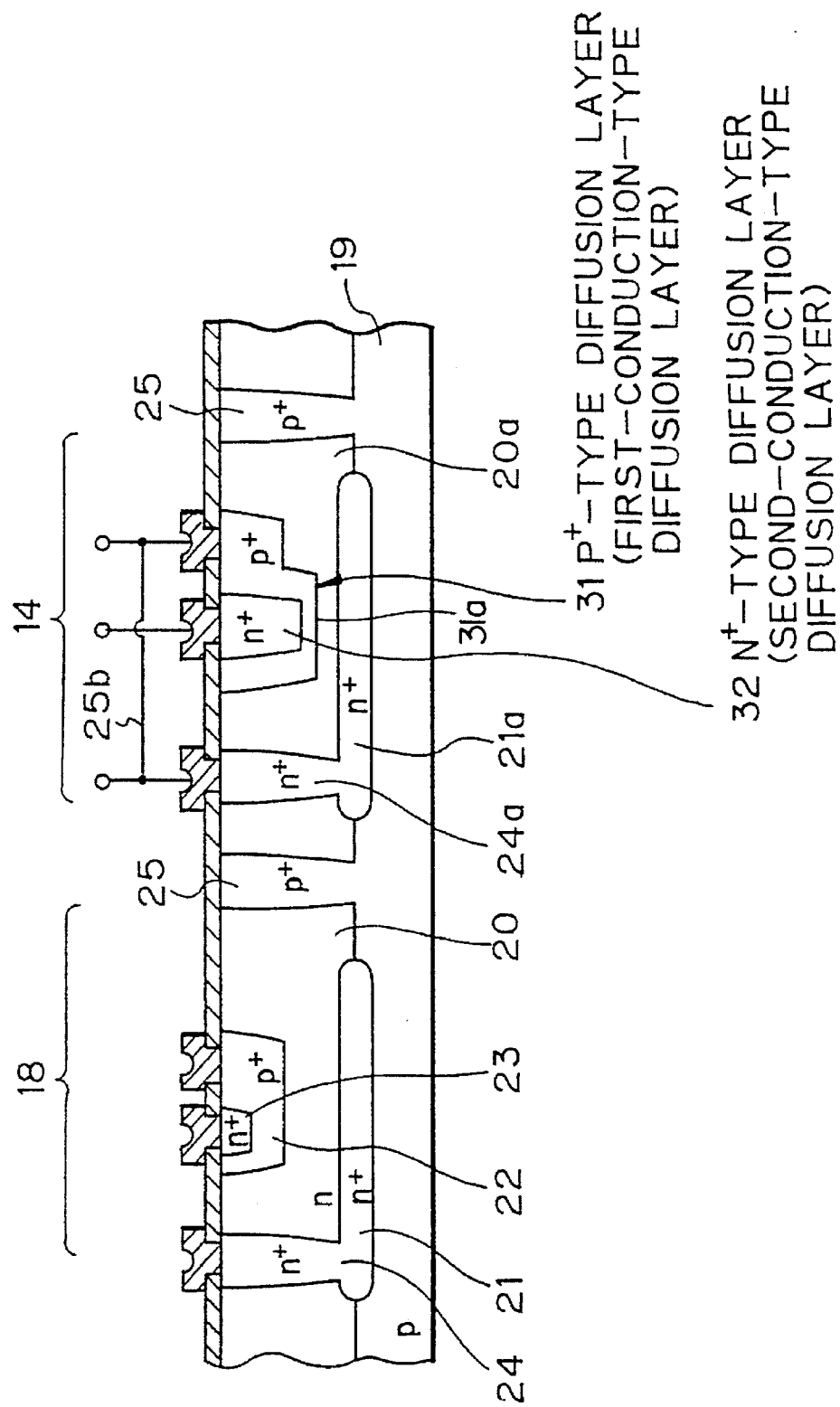

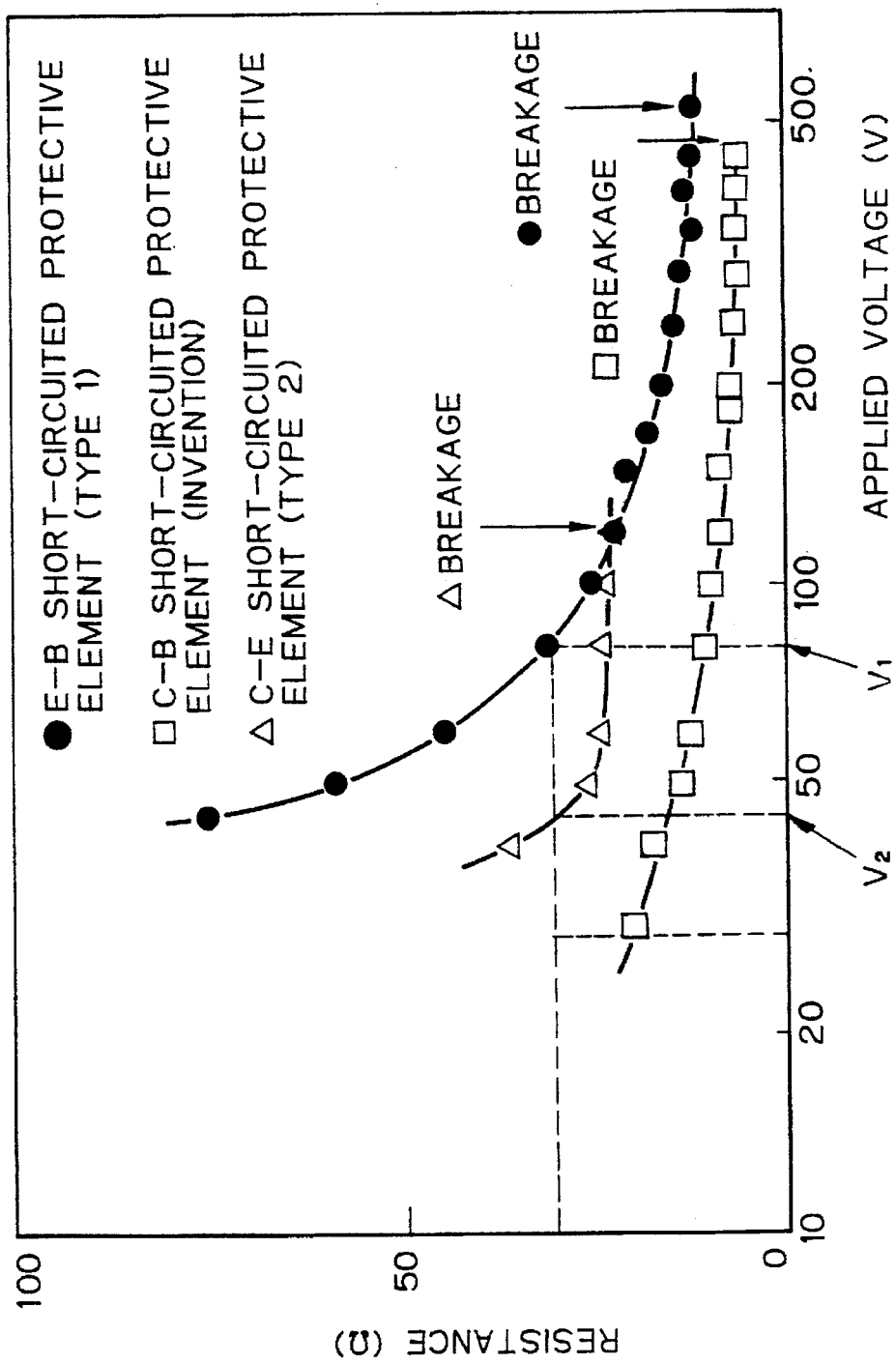

5,648,676

SEMICONDUCTOR DEVICE WITH PROTECTIVE ELEMENT

This application is a continuation, of application number 08/312,050, filed Sep. 23, 1994, now abandoned, which is a continuation of application Ser. No. 07/757,184, filed Sep. 10, 1991, now abandoned.

BACKGROUND OF THE INVENTION

1. Field of the Invention

The present invention relates to a semiconductor device and, more particularly, to a semiconductor device having a protective element.

2. Description of the Related Art

A protective element is connected to the input and output terminals of a semiconductor circuit (i.e., an internal circuit) of a semiconductor device, to protect the internal circuit from electrostatic energy penetrating from the outside by discharging the energy to a ground or a power source line.

FIG. 7 is a circuit diagram showing a standard protective diode 1 serving as a protective element for an internal circuit 2 of a semiconductor device. The protective diode 1 is connected between an input terminal 3 and a ground terminal 4 of the internal circuit 2, to produce an inverse bias with respect to an input voltage VDD. A pn junction of the protective diode 1 undergoes a breakdown phenomenon responsive to positive static electricity applied to the input terminal 3, to thereby discharge the static electricity to the ground terminal 4.

FIGS. 8(a) and 8(b) are sectional views showing a part of the semiconductor device. The left-hand side of each figure shows a vertical bipolar transistor 5 serving as the internal circuit 2 of FIG. 7, and the right-hand side thereof shows the protective element 1 formed on a p-type silicon substrate 6 on which the vertical bipolar transistor 5 is also formed.

To simplify the fabrication, a silicon layer 8a of the protective element 1 and a silicon layer 8 serving as a collector of the vertical bipolar transistor 5 are both formed on the silicon substrate 6, to the same depth and through the same process. The protective diode 1 has a p$^+$-type diffusion layer 10a and an n$^+$-type diffusion layer 11a, and the bipolar transistor 5 has a p$^+$-type base diffusion layer 10 and an n$^+$-type emitter diffusion layer 11, in which the depth of the diffusion layer 10a is the same as that of the diffusion layer 10, and the depth of the diffusion layer 11a is the same as that of the diffusion layer 11.

To increase the withstand voltage (surge voltage) of the protective element 1, a design size of the protective element 1 to be designed is selected so that the size thereof is larger than that of the bipolar transistor 5, whereby a large amount of current can flow therethrough.

An n$^+$-type buried region 7 (7a) is formed between the silicon substrate 6 and the silicon layer 8 (8a), and an n$^+$-type diffused collector lead 9 (9a) is connected to the buried region 7 (7a). A p$^+$-type separation, or isolation, diffusion layer 12 electrically separates the protective diode 1 and transistor 5 from adjacent element regions.

The protective element 1 of FIG. 8(a) is a collector-emitter (C-E) short-circuited element in which the n-type silicon layer 8a is short-circuited to the n$^+$-type diffusion layer 11a through the diffused lead 9a and buried region 7a.

The protective element 1 of FIG. 8(b) is a collector-base (C-B) short-circuited element in which the n-type silicon layer 8a is short-circuited to the p$^+$-type diffusion layer 10a through the diffused lead a and buried region 7a.

In these two cases, the n$^+$-type diffusion layer 11a is connected to the input terminal 3 of the internal circuit 2 of FIG. 7.

When a sudden excess voltage (surge voltage) is applied to the C-E short-circuited protective element 1 of FIG. 8(a) in an inverse bias direction, a pn junction 13 between the n$^+$-type diffusion layer 11a and the p$^+$-type diffusion layer 10a breaks down due to an impurity concentration thereof, thereby absorbing the excess voltage and protecting the internal circuit therefrom. In this case, a current flows mainly through the side face of the n$^+$-type diffusion layer 11a.

When the surge voltage is applied to the C-B short-circuited protective element 1 of FIG. 8(b), a pn junction 13 between the n$^+$-type diffusion layer 11a and the p$^+$-type diffusion layer 10a breaks down. At this time, a current flows through the side face of the n$^+$-type diffusion layer 11a, and accordingly, a potential of the p$^+$-type diffusion layer 10a under the n$^+$-type diffusion layer 11a is increased. As a result, a pn junction between the p$^+$-type diffusion layer 10a and the silicon layer 8a is biased in a forward direction, and carriers move from the silicon layer 8a into the diffusion layer 10a, and thus the n-type silicon layer 8a, p$^+$-type diffusion layer 10a, and n$^+$-type diffusion layer 11a operate as an inverse vertical bipolar transistor.

In this way, in the C-B short-circuited protective element 1, the surge voltage is absorbed due not only to the current flowing through the side face 13b of the n$^+$-type diffusion layer 11a but also to the current flowing through the bottom 13a of the diffusion layer 11a. The current flowing through the bottom 13a is proportional to a current amplification factor hfc of the inverse vertical bipolar transistor. The C-B short-circuited protective element 1 of FIG. 8(b), therefore, reduces a concentration of current on the side face 13b of the diffusion layer 11a and increases the withstand voltage thereof more than the C-E short-circuited protective element.

The inventors of the this invention measured the inverse current amplification factor hfc of a sample device as IC/IB=0.6. In the C-B short-circuited protective element, the current flowing through the pn junction at the side face 13b of the diffusion layer 11a is dispersed, thereby to increase a withstand voltage at the side face 13b.

An emitter-base (E-B) short-circuited protective diode is known in which the p$^+$-type diffusion layer 10a is short-circuited to the n$^+$-type diffusion layer 11a. FIG. 9(a) shows an equivalent circuit of the E-B short-circuited protective element. This protective element uses a breakdown phenomenon occurring at a pn junction between the n-type silicon layer 8a and the p$^+$-type diffusion layer 10a.

According to the C-B short-circuited protective diode, the depths of the diffusion layers 10a and 11a are the same as those of the diffusion layers 10 and 11 of the vertical bipolar transistor 5 of the internal circuit, and a current density on the side face 13b of the n$^+$-type diffusion layer 11a is larger than that on the bottom 13a thereof, and thus the side face 13b is easily damaged. In addition, a surge current is concentrated at the side face 13b within a short time, because the discharge resistance thereof is low, and thus a sufficient withstand voltage is not obtained.

According to the E-B short-circuited protective element, the area of the pn junction between the p$^+$-type diffusion layer 10a and the n-type silicon layer 8a is made large, to thus obtain a high withstand voltage. The impurity concentration of the silicon layer 8a is low, however, and thus a breakdown voltage at the pn junction is large, and therefore, the E-B short-circuited protective element is not adequate for protecting an internal circuit having a low withstand voltage.

FIG. 9(b) shows a result of measurements made by the inventors for an applied voltage (V) and a corresponding resistance value (Q) for each of the C-B, C-E, and E-B short-circuited protective element. In the figure, the withstand voltage of the E-B type is 600 V, the C-B type 470 V, and the C-E type 130 V.

The protective element is required not only to have a high withstand voltage but also to disperse a current or reduce a current density by increasing a current flowing through the protective element. Therefore, preferably, the resistance of the protective element against an applied voltage is made as small as possible. In consideration of the above, the inventors found that the most preferable protective element is the C-B short-circuited type.

SUMMARY OF THE INVENTION

An object of the invention is to provide a semiconductor device having a C-B short-circuited protective element which reduces a current density on a pn junction thereof and improves a withstand voltage thereof.

According to an aspect of the invention for accomplishing the object, there is provided a semiconductor device having a first-conduction-type semiconductor substrate (19), an internal circuit including a vertical bipolar transistor (18) formed in a second-conduction-type semiconductor layer (20) formed on the semiconductor substrate (19), and a protective element (14). The protective element (14) comprises a first-conduction-type diffusion layer (22a) formed at an upper part of a second-conduction-type semiconductor layer (20a) disposed on the semiconductor substrate (19), and a diffusion layer (27, 30) formed in the diffusion layer (22a). The diffusion layer (27, 30) is at least partly deeper than an emitter diffusion layer (23) of the vertical bipolar transistor (18).

According to another aspect of the invention, the semiconductor layer (20a) of the protective element (14) is short-circuited to the diffusion layer (22a) through at least an electrode (25b), as shown in FIG. 1.

According to still another aspect of the invention, at least one of the semiconductor layer (20a), diffusion layer (22a), and diffusion layer (27) of the protective element (14) is connected to a resistance element.

According to still another aspect of the invention, a part of the bottom of the diffusion layer (29) of the protective element (14) is made relatively closer to the bottom of the diffusion layer (23a), as shown in FIGS. 2(a) and 2(b).

According to still another aspect of the invention (FIG. 3), there is provided a semiconductor device having a first-conduction-type semiconductor substrate (19), an internal circuit (15) including a vertical bipolar transistor (18) formed in a second-conduction-type semiconductor layer (20), and a protective element (14). The protective element (14) comprises a first-conduction-type diffusion layer (31) formed at an upper part of a second-conduction-type semiconductor layer (20a) disposed on the semiconductor substrate (19), the diffusion layer (31) being deeper than a base diffusion layer (22) of the vertical bipolar transistor (18), and a second-conduction-type diffusion layer (32) formed in the diffusion layer (31), the diffusion layer (32) being deeper than an emitter diffusion layer (23) of the vertical bipolar transistor (18), wherein the semiconductor layer (20a) is short-circuited to the diffusion layer (31) through at least an electrode (25b).

According to still another aspect of the invention (FIGS. 4 and 5), there is provided a semiconductor device having an internal circuit formed on a first-conduction-type semiconductor substrate (6), and a protective element (1). The protective element (1) comprises a first-conduction-type diffusion layer (10a) formed at an upper part of a second-conduction-type semiconductor layer (8a) formed on the semiconductor substrate (6), and a second-conduction-type diffusion layer (11a) formed in the diffusion layer (10a), wherein at least one of the semiconductor layer (8a), the diffusion layer (10a) and the diffusion layer (11a) is connected to a resistance element (52, 61 to 63), and wherein the semiconductor layer (8a) is short-circuited to the diffusion layer (10a) through an electrode (25b) or resistance elements (61 to 63).

BRIEF DESCRIPTION OF THE DRAWINGS

FIG. 3 is a sectional view showing a semiconductor device having a protective element according to a third embodiment of the invention;

FIG. 9(b) is a view showing voltage-resistance characteristic curves C-E, and E-B short-circuited protective elements.

DESCRIPTION OF THE PREFERRED EMBODIMENTS

Figure 1A:
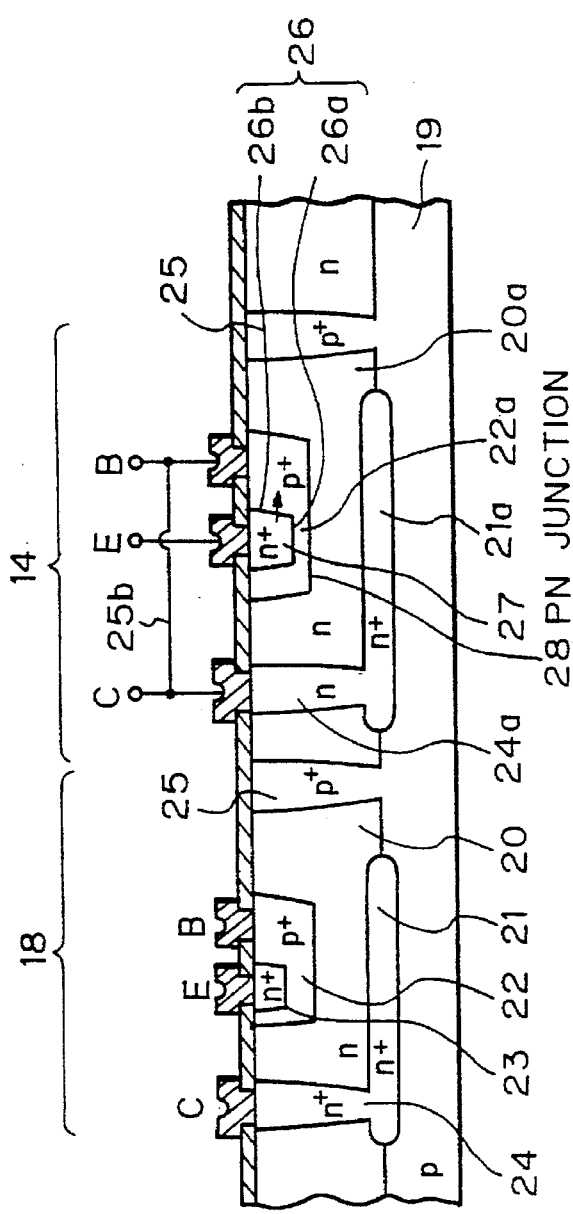
FIG. 1(a) is a sectional view showing a semiconductor device having a protective element according to a first embodiment of the invention.

Semiconductor devices having protective elements according to the embodiments of the invention will be explained in detail with reference to the drawings.

A basic arrangement of the semiconductor device according to the invention will be explained with reference to FIGS. 1(a) and 1(b).

The semiconductor device includes a first-conduction-type semiconductor substrate 19, an internal circuit including a vertical bipolar transistor 18 formed in a second-conduction-type semiconductor layer region 20, and a protective element 14. The protective element 14 comprises a first-conduction-type diffusion layer 22a formed at an upper part of a second-conduction-type semiconductor layer region 20a, and a second-conduction-type diffusion layer 27 formed in the diffusion layer 22a. The diffusion layer 27 is at least partly deeper than an emitter diffusion layer 23 of the vertical bipolar transistor 18.

Since the diffusion layer 27 of the protective element 14 is deeper than the emitter diffusion layer 23 of the bipolar transistor 18 of the internal circuit, the side face of the diffusion layer 27 is larger than a corresponding part of the conventional protective element having the same structure as the vertical bipolar transistor 18. This large side face of the diffusion layer 27 reduces a current density at the side face, to thereby increase the withstand voltage of the protective element 14.

The protective element (diode) 14 according to the invention is particularly a C-B short-circuited protective element. Since the diffusion layer 27 of the protective element is deep, a current density on the side face of the diffusion layer 27 is reduced. In addition, a distance between the bottom of the diffusion layer 27 and the bottom of the diffusion layer 22a is short, so that the thickness of a base of an inverse bipolar transistor defined by the portion of the first diffusion layer 22a formed under the diffusion layer 27 is small, which increases the current amplification factor of the inverse bipolar transistor. This increases the level of a vertically flowing current and further reduces the current density on the side face of the diffusion layer 27.

At least one of the semiconductor layer region 20a, the diffusion layer 22a and the diffusion layer 27 of the C-B short-circuited protective element 14 may be connected to a resistance element. This arrangement relaxes, due to a temporal constant, a temporary concentration of discharge current flowing through the protective element 14 and, as a result, a current flowing through the protective element 14 is reduced to increase the withstand voltage of the protective element 14.

Figure 2A:
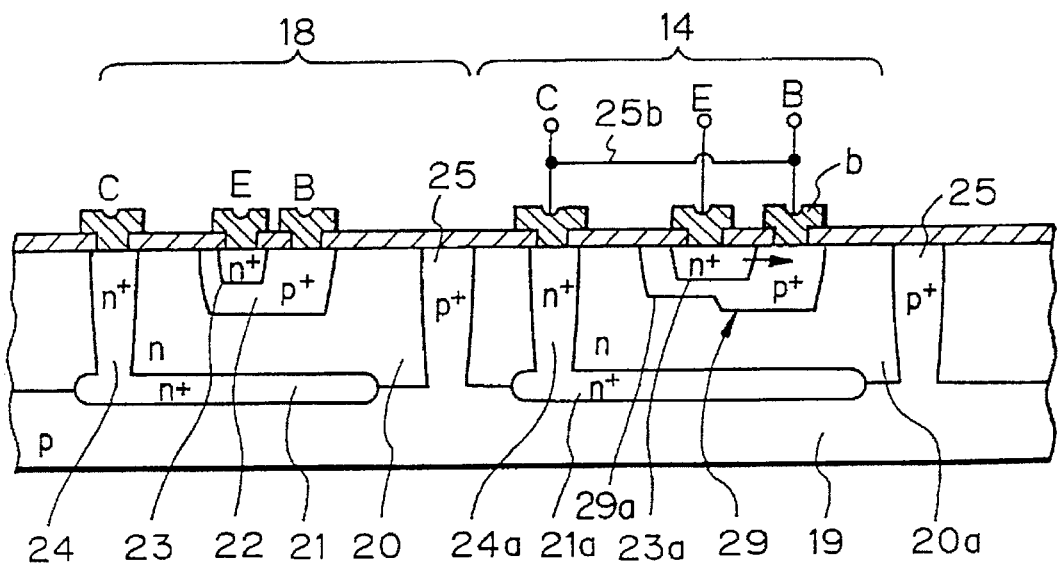
FIGS. 2(a) and 2(b) are sectional views showing semiconductor devices having protective diodes according to a second embodiment of the invention.

FIG. 2(a) shows a C-B short-circuited protective element 14 of another arrangement. The bottom of a first-conduction-type diffusion layer 29 includes a port 29a which is close to a bottom surface of a second-conduction-type diffusion layer 23a. This arrangement increases the amplification factor of an inverse bipolar transistor, reduces a discharge current flowing through the side face of the diffusion layer 23a, and reduces a current density on the side face.

FIG. 3 shows a C-B short-circuited protective element 14 of still another arrangement. A first-conduction-type diffusion layer 31 and a second-conduction-type diffusion layer 32 are increased in depth, thereby to reduce a distance between the diffusion layer 31 and a buried layer located under the diffusion layer 31. This arrangement reduces the collector resistance of an inverse vertical bipolar transistor, thereby to increase the amplification factor thereof. Since the diffusion layer 32 is deepened to enlarge the side face thereof, a current density on the side face is reduced.

FIGS. 4(a) to 4(c) and 5(a) to 5(d) show a C-B short-circuited protective element 14 of still another arrangement and modifications thereof. At least one of a second-conduction-type semiconductor layer 6, a first-conduction-type diffusion layer 10a, and a second-conduction-type diffusion layer 11a is connected to a resistance element 52 or to resistance elements 61 to 63. Even if the diffusion layer 10a and diffusion layer 11a are of the conventional configuration, a temporary concentration of discharge current flowing through the protective element 14 is relaxed due to a time constant. In addition, a current flowing through the protective element 14 is reduced thereby to increase the withstand voltage of the protective element 14.

[EXAMPLE 1]

Figure 1B:
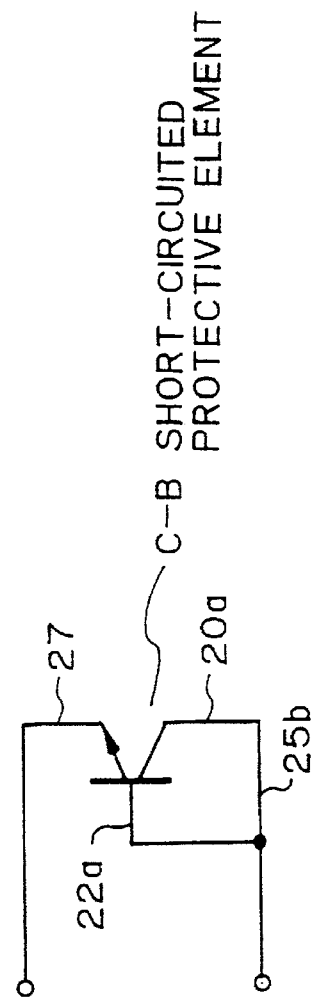
FIG. 1(b) is an equivalent circuit schematic of the protective element of FIG. 1(a)

FIG. 1(a) is a sectional view showing a semiconductor device having an internal circuit including a vertical bipolar transistor, and a C-B short-circuited protective element serving as a protective element connected to an input terminal of the internal circuit, according to the first embodiment of the invention. FIG. 1(b) is an equivalent circuit schematic of the protective diode of FIG. 11(a).

Figure 7:
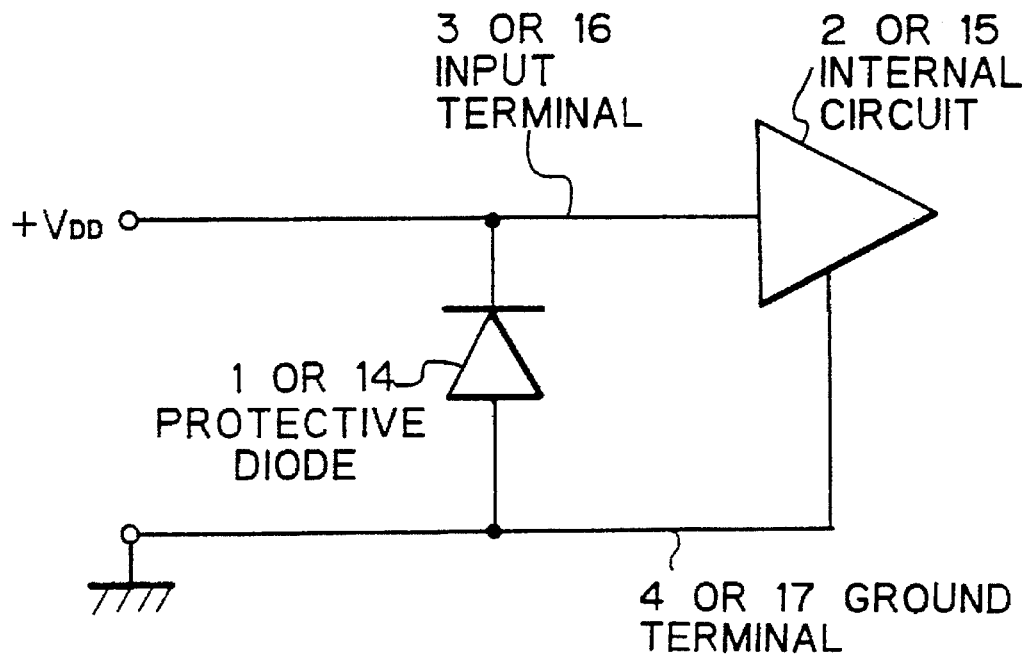
FIG. 7 is a connection diagram showing a protective diode and an internal circuit.

A connection between the protective diode and the internal circuit is the same as FIG. 7. The protective diode 14 is connected between an input terminal 16 and a ground terminal 17 of the internal circuit 15, to produce an inverse bias of an input voltage VDD. The input terminal 16 is connected to, for example, a base diffusion layer of the bipolar transistor 18 of the internal circuit 15. Depending on the kind of internal circuit 15, the input terminal 16 may be connected to a gate of a MOS transistor or to another element.

The vertical bipolar transistor 18 of FIG. 1(a) corresponds to the internal circuit 15 of FIG. 7. A p-type silicon semiconductor substrate 19 (FIG. 1(a) is connected to the ground terminal 17 of the internal circuit 15 (FIG. 7). An n-type silicon layer 20 of several micrometers thick having an impurity concentration of about $10^{16}$ cm$^{-3}$ is laminated on the substrate 19. An n$^+$-type buried region 21 is formed between the silicon substrate and the silicon layer 20. The silicon layer 20 serves as a collector layer of the bipolar transistor 18.

A p$^+$-type base diffusion layer 22 having an impurity concentration of $10^{17}$ to $10^{18}$ cm$^{-3}$ is formed to about 2 micrometers thick from the surface of the silicon layer 20 above the buried region 21. An n$^+$-type emitter diffusion layer 23 having a maximum impurity concentration of about $10^{19}$ cm$^{-3}$ is formed on a part of the surface of the base diffusion layer 22 to a depth of about one micrometer. An n$^+$-type diffused collector lead 24 is formed in a depth so as to reach the buried region 21. Around the diffused collector lead 24, a p$^+$-type separation (i.e., isolation) diffusion layer 25 for electrically separating the element regions of 14 and 18 is formed in a depth so as to reach the substrate 19.

The protective element, i.e., the protective element 14 shown in the right side of FIG. 1(a) comprises a silicon layer region 20a and a p$^+$-type diffusion layer 22a, which are similarly arranged to the layers (regions) 20 and 22 of the bipolar transistor 18 but are made larger, to thereby increase the withstand voltage of the protective element 14.

An n$^+$-type buried region 21a is formed between the silicon substrate 19 and the silicon layer region 20a. The p$^+$-type diffusion layer (first-conduction-type diffusion layer) 22a having a maximum impurity concentration of $10^{17}$ to $10^{18}$ cm$^{-3}$ is formed at an upper part of the silicon layer 20a to a depth of about 2 micrometers from the surface of the silicon layer 20a. The depth of the diffusion layer 22a is substantially equal to that of the base diffusion layer 22 of the bipolar transistor 18.

An n$^+$-type diffusion layer (second-conduction-type diffusion layer) 27 having a maximum impurity concentration of about $10^{19}$ cm$^{-3}$ is formed on a part of the surface of the p$^+$-type diffusion layer 22a to a depth of about 1.5 micrometers. The diffusion layer 27 is deeper than the emitter diffusion layer 23 of the bipolar transistor 18. An n$^+$-type diffused lead 24a is connected to the buried region 21a.

The $n^+$-type diffusion layer 27 is connected to the input terminal 16 of the internal circuit 15 (FIG. 7). The $p^+$-type diffusion layer 22a and silicon layer region 20a are electrically short-circuited to each other and are connected to the ground terminal 17 through an electrode 25b, the $n^+$-type buried region 21a, and the diffused lead 24a.

When a positive surge voltage is applied to the input terminal 16 of the semiconductor device, a pn junction 26 between the $n^+$-type diffusion layer 27 and the $p^+$-type diffusion layer 22a breaks down due to the impurity concentration, and the surge voltage is absorbed as a surge current by the protective element 14, to thereby protect the bipolar transistor 18 of the internal circuit 15 from the surge voltage.

In this case, the surge current flows through the side face 26b in a greater amount than through the bottom 26a of the pn junction 26. Due to the current flowing through the side face 26b of the pn junction 26, a potential of the $p^+$-type diffusion layer 22a is increased, and a pn junction 28 between the $p^+$-type diffusion layer 22a and the silicon layer 20a is biased in a forward direction thereby to inject carriers. As a result, an inverse vertical bipolar transistor is formed by the $n^+$-type diffusion layer 27, $p^+$-type diffusion layer 22a, and n-type silicon layer 20a. In this embodiment, the operation of this inverse vertical bipolar transistor is referred to as the inverse bipolar transistor operation.

Since the $n^+$-type diffusion layer 27 is deep, the thickness of the $p^+$-type diffusion layer 22a between the $n^+$-type diffusion layer 27 and the silicon layer 20a is thinner (i.e., smaller) than that of the conventional protective element and, therefore, the width of a base of the inverse vertical bipolar transistor becomes narrower. Consequently, the inverse current amplification factor (hereinafter referred to as the inverse $\beta$) of the inverse vertical bipolar transistor becomes larger than the conventional factor.

As a result, a current passing through the bottom 26a of the pn junction 26 is increased thereby to further disperse the current as well as increasing the withstand voltage of the protective diode 14 up to 550 V.

[EXAMPLE 2]

FIG. 2(a) shows a semiconductor device having a bipolar transistor 18 as an internal circuit and a C-B short-circuited protective diode 14 for protecting the internal circuit, according to the second embodiment of the invention. The protective element 14 of this embodiment differs from the embodiment of FIG. 1(a) in that a part of a $p^+$-type diffusion layer 29 under the bottom of an $n^+$-type diffusion layer 23a slightly exceeds 1.5 micrometers and is shallower than the remaining part, which is formed in the same manner and to the same depth (about 2 micrometers) as a base diffusion layer 22 of the bipolar transistor 18.

The shallow portion of the $p^+$-type diffusion layer 29 is formed in a separate process, carried out before or after the process of forming the remaining deeper part.

In the protective element 14, the width of a base of an inverse vertical bipolar transistor formed by an n-type silicon layer 20a, the $p^+$-type diffusion layer 29, and the $n^+$-type diffusion layer 23a is narrowed to increase the inverse D thereof. As a result, a current flowing through the bottom of the $n^+$-type diffusion layer 23a is increased, to thereby reduce a concentration of electric field on the side face of the diffusion layer 23a.

If the deeper part of the diffusion layer 29 is located away from an electrode b of the diffusion layer 29, the current flowing through the side face of the diffusion layer 23a is increased.

Figure 2B:
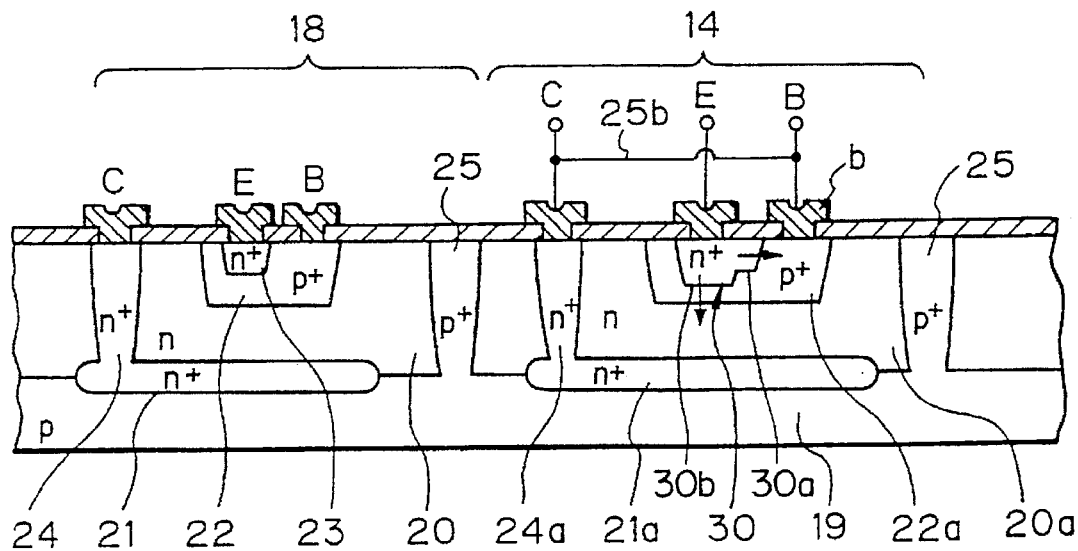

FIG. 2(b) shows a modification of the second embodiment of FIG. 2(a). A part 30a of an $n^+$-type diffusion layer 30 of a protective element 14, close to an electrode b, is formed by the same process as an emitter diffusion layer 23 of a bipolar transistor 18 to the same depth (about one micrometer) as the diffusion layer 23, and the remaining part 30b is formed to a greater depth of about 1.5 to 2.0 micrometers. The deeper part 30b of the $n^+$-type diffusion layer 30 may be formed in a separate process before forming the shallower parts.

In the protective element 14 of FIG. 2(b), 30a the width of a base of an inverse vertical bipolar transistor formed by a silicon layer region 20a, a $p^+$-type diffusion layer 22a, and the $n^+$-type diffusion layer 30 is nearly the same as that of the first embodiment, to increase the inverse $\beta$ of the inverse transistor. The $n^+$-type diffusion layer 30, however, is wider than the first embodiment, so that a current density on the side face of the diffusion layer 30 is smaller than that of the first embodiment.

Similar to the embodiment of FIG. 2(a), a surge current is thoroughly dispersed in the $n^+$-type diffusion layer 30, to thus improve the withstand voltage of the protective diode 14.

[EXAMPLE 3]

FIG. 3 is a sectional view showing a semiconductor device having a bipolar transistor 18 as an internal circuit and a C-B short-circuited protective element 14 for protecting the internal circuit, according to the third embodiment of the invention. The protective diode 14 of this embodiment is characterized in that a part 31a of a $p^+$-type diffusion layer 31 is of a depth of about 3 micrometers, and corresponding to this deep part, an $n^+$-type diffusion layer 32 has a depth of about 2.5 micrometers. A distance between the respective bottoms of the part 31a of the $p^+$-type diffusion layer 31 and $n^+$-type diffusion layer 32 is narrower than the width of a base of the bipolar transistor 18 by about 0.5 micrometers.

With this arrangement, a distance from the part of 31a of the $p^+$-type diffusion layer 31 to an $n^+$-type buried region 21a of an inverse vertical bipolar transistor of protective element 14 is made short, thereby to reduce the collector resistance and thereby to increase the efficiency of carrier injection and the amplification factor of the inverse vertical bipolar transistor, to thus further increase a vertically flowing current.

The side face of the diffusion layer 32 of the protective element 14 is made large, to thus reduce a current density on the side face to a greater extent than in the previous embodiments. At the same time, the inverse $\beta$ of the inverse bipolar transistor is made larger, to thus thoroughly disperse a surge current and thereby improve the withstand voltage of the protective element 14.

In the first to third embodiments, the silicon substrate 19 is p type, but the invention is also applicable for an n type silicon substrate.

[EXAMPLE 4]

In each of the previous embodiments, the depths of the $n^+$-type diffusion layer and $p^+$-type diffusion layer of the protective element are changed to reduce a horizontal current density in the $n^+$-type diffusion layer and increase the withstand voltage of the protective element. In the C-B short-circuited protective element, one of the silicon and diffusion layers may be connected to a resistance element, to thus improve the withstand voltage. This embodiment will be now explained.

Figure 4A:
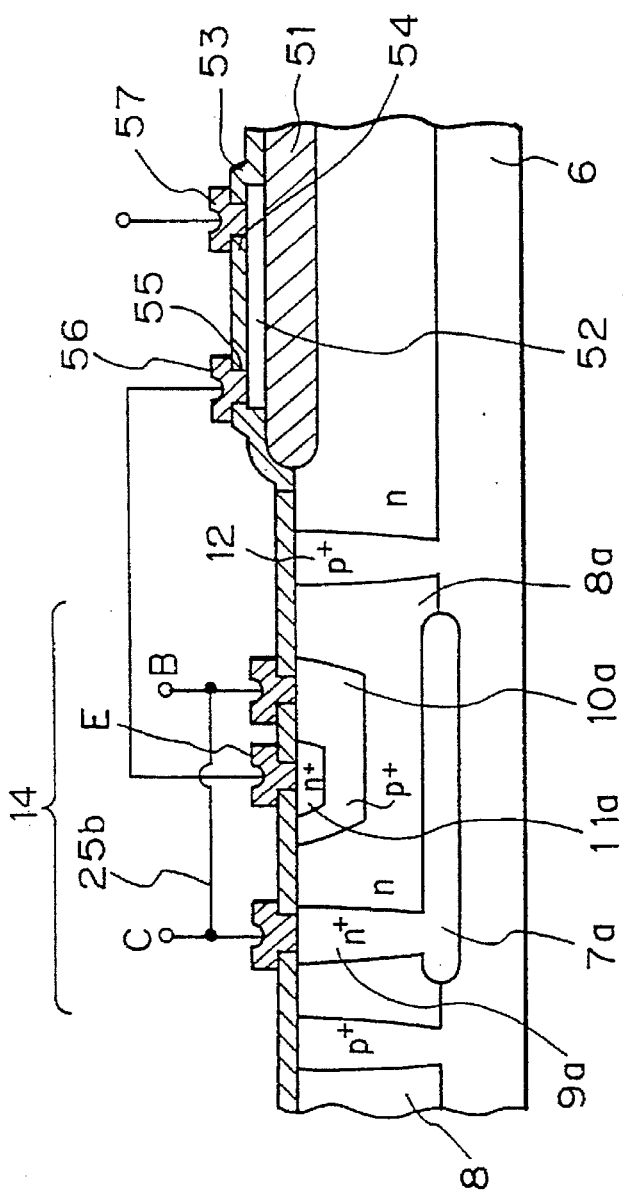
FIG. 4(a) is a sectional view showing a protective element according to a fourth embodiment of the invention.

FIG. 4(a) shows a C-B short-circuited protective element 14 according to the fourth embodiment of the invention, for protecting an internal circuit of a semiconductor device.

The protective element 14 is surrounded by a separation (i.e., isolation) diffusion layer 12 around which an $SiO_2$ film 51 of about 5000 Angstroms in thickness is formed according to a selective oxidation method. A resistance element 52 made of, for example, polycrystalline silicon is formed on the film 51, and an interlayer insulation film 53 made of $SiO_2$ is formed on the resistance element 52. Two contact holes 54 and 55 are opened on the insulation film 53, to expose both ends of the resistance element 52.

An electrode 56 is formed in the contact hole 55 and connected to an $n^+$-type diffusion layer 11a of the protective diode 14. An electrode 57 is formed in the contact hole 54 and connected to a power source VDD of the internal circuit.

Figure 4C:
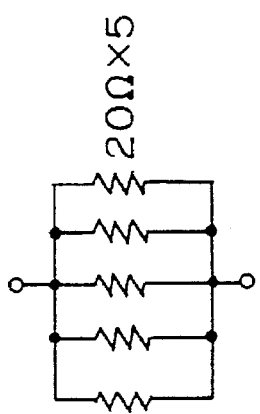
FIG. 4(c) is a view showing a modification of a resistor shown in FIG. 4(b)
Figure 4B:
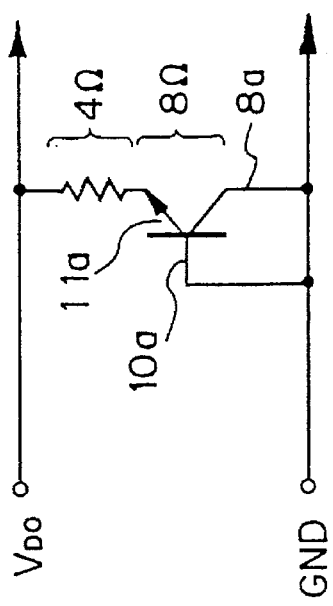
FIG. 4(b) is an equivalent circuit schematic of the protective element of FIG. 4(a)

FIG. 4(b) shows an equivalent circuit of the protective element 14 of FIG. 4(a).

An operation of the fourth embodiment will be explained in comparison with the prior art.

Figure 8A:
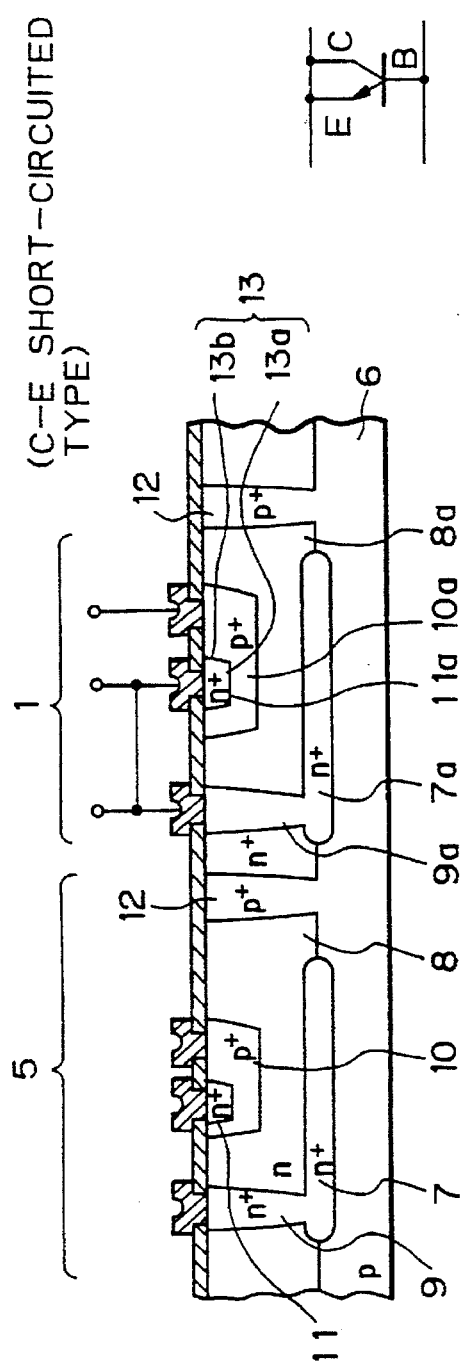
FIGS. 8(a) and 8(b) are sectional views showing semiconductor devices having conventional protective elements.
Figure 8B:
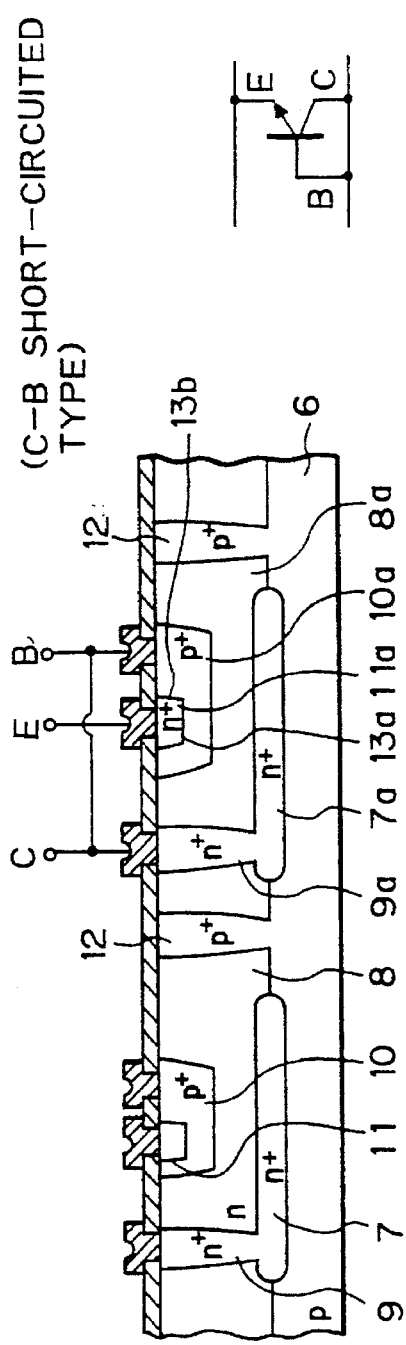
Figure 9A:
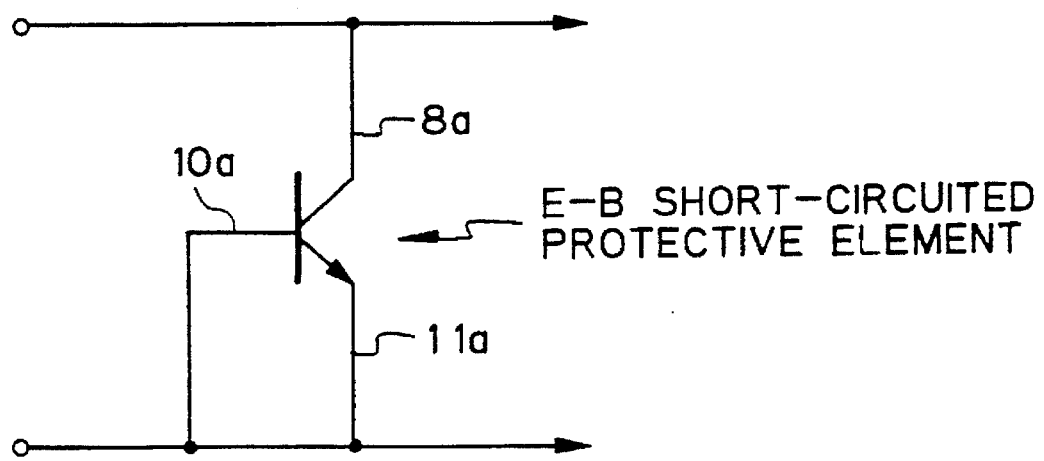
FIG. 9(a) is a view showing an equivalent circuit schematic of a conventional protective element.

In the E-B short-circuit protective element whose equivalent circuit is shown in FIG. 9(a), the $p^+$-type diffusion layer 11a and the $n^+$-type diffusion layer 10a shown in FIG. 8 are short-circuited to each other through an electrode. This protective element has a large pn junction area and a high withstand voltage as shown in FIG. 9(b). Since an impurity concentration of the silicon layer 8a is low, however, the breakdown voltage thereof is high.

Namely, the E-B short-circuited protective element is not appropriate for a device with an internal circuit having a low withstand voltage. For this kind of internal circuit, it is necessary to arrange a protective element having a breakdown voltage suitable for the withstand voltage and electricity absorbing capacity of the internal circuit.

The breakdown voltage of the C-B short-circuited protective element according to the invention is about one third that of the E-B short-circuited protective element. The C-B short-circuited protective element, however, has a low discharge resistance so that a current is concentrated into the $n^+$-type diffusion layer 11a in a short time, to thus lower the withstand voltage thereof and durability as a protective element.

When designing a semiconductor device having an internal circuit and a C-B short-circuited protective element according to the invention, it is important to select suitable withstand and breakdown voltages of the protective element for the internal circuit, yet none of the prior art provides design criteria and means for reasonably evaluating and selecting a proper protective element for a given internal circuit.

When selecting a reasonable protective element for a given internal circuit, it is necessary (1) to quantitatively evaluate the protective element according to criteria, i.e., measuring the protective capacity of the protective element regardless of the structure thereof, and classifying the protective element according a result of the measurement, and (2) to establish a method of selecting an optimum protective element for the given internal circuit according to the classification.

Since an electrostatic breakdown phenomenon of the protective element accompanies a high voltage and a high current, it is not adequately handled by conventional semiconductor relational expressions. Namely, a new evaluation method must be developed with the use of simpler parameters to permit easily designing an internal circuit.

A method according to the invention of selecting an optimum protective element for an internal circuit of a semiconductor device uses a resistance value defined as:

applied energy/$\int$(discharge current)$^2$dt and with this as an evaluation parameter, determines the electrostatic energy absorbing capacity of the protective element.

According to the prior arts, a protective element is empirically selected, and if the selected element is not adequate for a given internal circuit, it is replaced with another; this process must be repeated until an optimum protective element is found for the internal circuit. On the other hand, the method of the invention can select a reasonable and optimum protective element for the given internal circuit, in a short time.

A principle of the invention method of classifying protective elements according to the capacities thereof will be explained.

Since an internal circuit of a semiconductor device is mainly broken (i.e., damaged) by heat, an absorption of electrostatic energy by the internal circuit, instead of a current flowing through the circuit, is considered with the energy as a variable, to determine why the circuit is broken.

When static electricity is applied to the internal circuit, the circuit is safe if the protective element for the circuit sufficiently absorbs the electrostatic energy, but at this time, the protective element itself must not be broken. The protective element is evaluated and classified according to its (1) electrostatic energy absorbing capacity and (2) energy absorbing limit corresponding to a withstand voltage but evaluated by energy.

Firstly, a quantification of (1) the electrostatic energy absorbing capacity will be studied.

Figure 10:
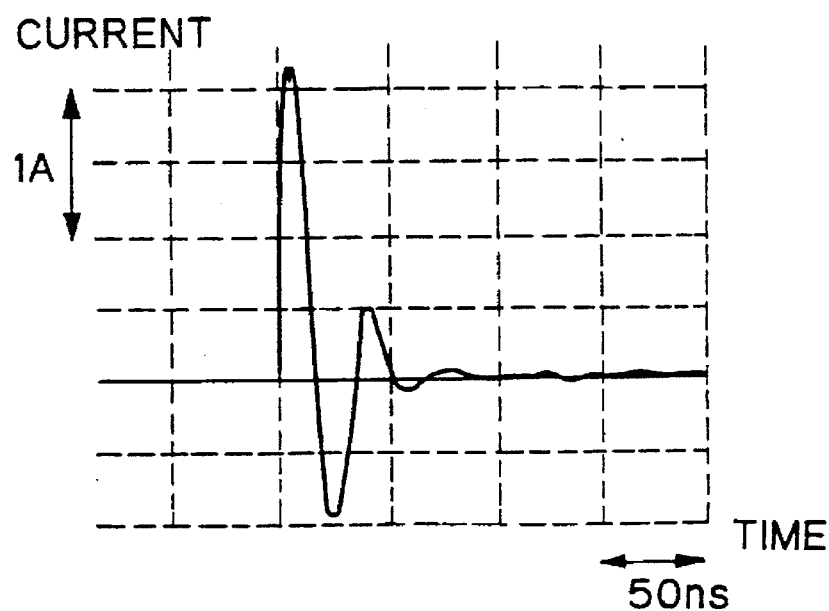
FIG. 10 is a graph showing an example of a discharge current waveform of a protective element.

A ratio of energy absorbed by an internal circuit and a protective element in a semiconductor device is determined by a ratio of the respective resistance values of the internal circuit and the protective element. The lower the resistance of an element, the larger the energy absorbed by the element. A resistance ($\gamma$) of the protective element is not constant with respect to time. In addition, a discharge waveform of the protective element when an electrostatic energy ($\frac{1}{2} \times CV^2$) is applied thereto is transient as shown in FIG. 10 (with a power source voltage V and a capacitance C in FIG. 6, a discharge waveform of the protective element alone is displayed on an oscilloscope using a current probe).

Energy absorbed by the protective element is $\int \gamma i^2 dt$. The resistance value of the protective element is considered to be that of a variable resistor. Since it is difficult to grasp a discharge phenomenon of the variable resistor, the resistance value of the protective element is considered to be constant, by using the following averaging equation:

$$\int \gamma i^2 dt = R \int i^2 dt$$

where R is the constant resistance value.

In the protective element alone:

$$\int \gamma i^2 dt = (\tfrac{1}{2})CV^2 \text{ (applied energy)}$$

The resistance value of the protective element is defined as follows:

$$R = (\tfrac{1}{2})CV^2 / \int i^2 dt$$

Since the $\int i^2 dt$ is found from the measured waveform and since the $(\tfrac{1}{2})CV^2$ is the applied energy, the R of the protective element is actually measurable. Based on this R, the electrostatic energy absorbing capacity of the protective element is evaluated.

Next, (2) the energy absorbing limit of the protective element is defined as energy absorbed by the protective element when it is broken. This is obtained by substituting a breakdown voltage of the protective element for the electrostatic energy $(\frac{1}{2})CV^2$.

A principle of the inventive method of selecting an optimum protective element for a given internal circuit will be explained.

After evaluating a protective element as mentioned above, an optimum protective element is selected for a given internal circuit. The suitability of the selected protective element is determined according to whether or not the protective element and the internal circuit protected by the protective element can safely withstand an expected maximum value of applied energy.

As a first step of the optimization, (1) the maximum applied energy is distributed to the protective element and the internal circuit protected by the protective element, according to measured resistance values R of them as coefficients for the energy distribution. With a required withstand voltage of 300 V and a capacitance of 200 pF, the expected maximum applied energy is expressed as $(\frac{1}{2})CV^2 = 9 \times 10^{-6}$ joules. This energy is distributed to the protective element and to the internal circuit, connected in parallel with the protective element, in inverse proportion to the respective resistances of the protective element and the internal circuit.

Thereafter, (2) the distributed energy quantities (EP and EI) of the protective element and internal circuit are compared with the respective energy absorbing limits EPMAX and EIMAX (limit energy quantities at which the protective element and internal circuit are broken) of the protective element and internal circuit, thereby determining a risk of breakage of the protective element and internal circuit.

As a result of the comparison, (a) if the protective element and internal circuit are both within a safe range, the protective element is determined to be adequate, and (b) if the protective element is likely to break, the energy absorbing limit of the protective element must be increased. In this case, the protective element must be replaced with another having a larger energy absorbing limit as well as the same electrostatic energy absorbing capacity evaluated according to the resistance R. In addition, (c) if the internal circuit is likely to break, the resistance R of the protective element must be lowered, i.e., the electrostatic energy absorbing capacity of the protective element must be increased. In this case, the protective element must be replaced with another having an electrostatic energy absorbing capacity that prevents a breakage of the internal circuit, as well as an energy absorbing limit matching the capacity.

In this way, the protective element is optimized for the internal circuit protected by the protective element, when designing a semiconductor device. Since it is difficult to classify the internal circuit, an evaluation parameter (R) of each block of the internal circuit is accumulated, and a simulation is carried out according to the accumulated parameters, to estimate the resistance and breakdown strength of the internal circuit. This breakdown strength corresponds to the withstand voltage of a part of the internal circuit where most current paths concentrate, and determines the energy absorbing limit of the internal circuit.

In this way, the optimum protective element for the given internal circuit is designed. If a certain protective element is determined to be inadequate according to an evaluation of the resistance thereof, the protective element may be reinforced and given a greater capacity. It is also possible to reinforce the properties of the protective element to make it suitable for a specific internal circuit.

With this classification method, the inventors actually evaluated several protective elements. A result of this is now explained.

To understand the energy absorbing limit of each protective element, the withstand voltages of the protective element alone were tested according to a conventional test method. Results of the test are shown in Table 1. The capacitance C of a capacitor used for the test was 200 pF, and a withstand voltage obtained was substituted for V of the equation $(\frac{1}{2})CV^2$, to calculate the energy absorbing limit. In this calculation, energy consumed by the internal resistance of the circuit was taken into account.

TABLE 1

Type of protective element
  Type 1: E-B short-circuited type
  Type 2: C-E short-circuited type
Withstand voltage:
  Type 1: 600 V
  Type 2: 130 V
Energy absorbing limit:
  Type 1: $2.08 \times 10^{-5}$ J
  Type 2: $1.35 \times 10^{-6}$ J As shown in Table 1, the protective element of type 1 has a withstand voltage of 600 V and an energy absorbing limit of $2.08 \times 10^{-5}$ joules, and the protective element of type 2 has a withstand voltage of 130 V and an energy absorbing limit of $1.35 \times 10^{-6}$ joules.

To determine the energy absorbing capacity of each of the protective elements, the resistance evaluation method was carried out to evaluate the resistance R of the protective elements of type 1 (E-B short-circuited type) and of the type 2 (C-E short-circuited type). The results are shown in FIG. 9(b), in which an abscissa (logarithmic scale) represents an applied voltage. As shown in this figure, the resistance (discharge resistance) is suddenly lowered after a certain voltage and is saturated to a fixed value. The changing point of the resistance is considered to correspond to a voltage whereat the protective element starts to operate to absorb the energy. This voltage is called the operating voltage. In FIG. 9(b), applied voltages V1 and V2, where the resistance R is 30 ohms, are the operating voltages of the protective elements of type 1 and type 2, respectively.

Unlike the prior art evaluation method which compares only the withstand voltages of protective elements with one another, the method of the invention evaluates the resistance of each protective element. Namely, the invention method totally evaluates each protective element.

Table 1 and FIG. 9(b) show that (1) the protective element of type 1 has a large energy absorbing limit and thus is appropriate for improving the withstand voltage of a relatively strong internal circuit but is not applicable for a weak internal circuit which breaks at a low voltage, because the operating voltage of the type 1 is too high to protect the weak internal circuit, and that (2) the protective element of type 2 has a small energy absorbing limit and thus is not practically usable due to an insufficient strength, but may be effective when the internal circuit is very weak, and will break at a low voltage because the operating voltage of the type 2 is low. In this way, the protective elements are classified.

In the protective element of type 1, a breakdown phenomenon occurs from a collector C (an n-type layer) to a base B (a $p^+$-type layer) when a high voltage is applied to a power source line Vcc and, accordingly, a bipolar action occurs from the collector C to an emitter E. At this time, the operating voltage is relatively high.

In the protective element of type 2, the breakdown phenomenon occurs from an emitter E (an $n^+$-type layer) to a base B (a $p^+$-type layer) when a high voltage is applied to a power source line Vcc. At this time, the operating voltage is relatively low.

An application of the optimization method of the invention will be explained. The suitability of a protective element for an internal circuit is checked according to this method, and then a more effective protective element is developed. Table 2 shows the withstand voltages of internal circuits provided with the protective elements of types 1 and 2, respectively, and the withstand voltages of the protective elements alone. Here, a required withstand voltage is 300 V.

TABLE 2

Electrostatic withstand voltage of:
  internal circuit with type 1: 470 V
  internal circuit with type 2: 160 V
Electrostatic withstand voltage of:
  protective element of type 1 alone: 600 V
  protective element of type 2 alone: 130 V As shown in Table 2, the internal circuit provided with the protective element of type 1 has a withstand voltage of 470 V, and the internal circuit provided with the protective element of type 2 has a withstand voltage of 160 V. The withstand voltages of the protective elements of type 1 and type 2 alone are 600 V and 130 V, respectively.

Next, the breakdown energy of the internal circuit is obtained from the withstand voltage thereof and, the energy quantities distributed to the protective element and internal circuit are obtained from the corresponding resistances thereof. The distributed energy quantities of the internal circuit and protective element are compared with the energy absorbing limits thereof, respectively, to determine a break location of the internal circuit. Since the withstand voltage of the protective element of type 2 is too low for practical use, only the protective element of type 1 will be discussed. The results are shown in Table 3.

TABLE 3

Type of protective element: Type 1
Breakdown energy of internal circuit: $1.27 \times 10^{-5}$ J
Energy distributed to:
  protective element: $1.11 \times 10^{-5}$ J
  internal circuit: $1.61 \times 10^{-6}$ J
Energy absorbing limit of:
  protective element: $2.08 \times 10^{-5}$ J
  internal circuit: $1.44 \times 10^{-6}$ J
Result of:
  protective element: not broken
  internal circuit: broken As shown in Table 3, with the type 1 protective element, the breakdown energy of the internal circuit is $1.27 \times 10^{-5}$ joules. This breakdown energy corresponds to an energy level at which the internal circuit is broken and calculated by substituting 470 V for "V" of the equation $(\frac{1}{2})CV^2$ and by considering an energy consumption due to the internal resistance of the circuit. Thereafter, the breakdown energy is distributed to the protective element and internal circuit according to the respective resistances thereof. The energy distributed to the protective element is $1.11 \times 10^{-5}$ joules, and the energy distributed to the internal circuit is $1.61 \times 10^{-6}$ joules. On the other hand, the energy absorbing limit of the protective element alone is $2.08 \times 10^{-5}$ joules as shown in Table 1, and the energy absorbing limit of the internal circuit alone is $1.44 \times 10^{-6}$ joules, which is calculated by carrying out a voltage withstand test on the internal circuit alone to determine a withstand voltage, and substituting the measured withstand voltage for the "V" of the equation $(\frac{1}{2})CV^2$. From the comparison of the distributed energy values with the energy absorbing limits, it is determined that the protective element is not broken because $1.11 \times 10^{-5} < 2.08 \times 10^{-5}$, and that the internal circuit is broken because $1.61 \times 10^{-6} > 1.44 \times 10^{-6}$. As a result, it is determined that the withstand voltage 470 V of the internal circuit having the protective element of type 1 is lower than the withstand voltage 600 V of the protective element alone.

Since the break location is found, the suitability of the protective element and an optimizing measure become clear. Since the internal circuit is determined at break, the resistance R of the protective element must be lowered to increase the electrostatic energy absorbing capacity thereof. In the internal circuit with the type 1 protective element, it is understood that the protective element absorbs energy of only about one-half ($\frac{1}{2}$) second of its energy absorbing limit, while the internal circuit absorbs more energy than its energy absorbing limit at break. To completely protect the internal circuit and increase the withstand voltage of the internal circuit, it is necessary to lower the resistance of the protective element to increase the electrostatic energy absorbing capacity thereof.

As mentioned above, the protective element of type 1 basically satisfies the requirements of the internal circuit but its operating voltage must be further reduced to be a better protective element, because the withstand voltage 470 V of the internal circuit exceeds the required withstand voltage 300 V.

To achieve this, the characteristics of the protective element of type 2 having a low operating voltage may be added to the type 1 protective element, thereby providing a new type of protective element. The resistance R of this new type is shown in FIG. 9(b) and its withstand voltage in Table 4, in comparison with those of the type 1 protective element.

In FIG. 9(b), V1 is the operating voltage of the type 1 protective element, and V3 is the operating voltage of the new type of protective element.

Table 4 shows the electrostatic withstand voltages and energy absorbing limits of the protective elements of type 1 and new type.

TABLE 4

Electrostatic withstand voltage of:
  new type alone: 470 V
  type 1 alone: 600 V
Energy absorbing limit of:
  new type: $1.07 \times 10^{-5}$ J
  type 1: $2.08 \times 10^{-5}$ J An example of the new type of protective element is a C-B short-circuited transistor. When a high voltage is applied to a power source line Vcc, a breakdown phenomenon occurs from an emitter E (an $n^+$-type layer) to a base B (a $p^+$-type layer), and therefore, an inverse bipolar action occurs from the emitter E to a collector C. As a result, a current path from the emitter E to the base B and a current path from the emitter E to the collector C are formed. This new type of protective element has a low operating voltage and a low resistance R. Namely, the new type of protective element having the low operating voltage is suitable for an internal circuit that breaks at a low voltage. In addition, the new type of protective element has a low resistance R, a high electrostatic energy absorbing capacity, and a reasonable withstand voltage (energy absorbing limit).

The inventors evaluated an internal circuit provided with the new type of protective element and confirmed the effect thereof. Table 5 shows the withstand voltage of the internal circuit provided with the new type of protective element. For comparison, the withstand voltage of an internal circuit provided with the type 1 protective element is also shown in the table.

TABLE 5

Electrostatic withstand voltage of:
  internal circuit with new type: 510 V
  internal circuit with type 1: 470 V As shown in Table 5, the internal circuit provided with the type 1 protective element has a withstand voltage of 470 V, which is lower than the withstand voltage 600 V of the protective element alone, and the internal circuit provided with the new type of protective element has a withstand voltage of 510 V, which is higher than the withstand voltage 470 V of the protective element alone. The reason for this is because, as a result of the addition of the of new type protective element and its high energy absorbing capacity, the internal circuit has been strengthened, and the energy absorbing limit of the internal circuit as a whole is increased more than the energy absorbing limit of the new type of protective element alone.

Table 6 shows the breakdown energy of the internal circuit provided with the new type of protective element, and energy quantities distributed to the protective element and internal circuit, respectively, at the time of breakdown.

Table 7 shows the energy absorbing limits of the protective element and internal circuit, respectively.

TABLE 6

Breakdown energy of internal circuit with new type of protective element: $1.22 \times 10^{-5}$ J
Energy distributed to:
  protective element: $1.16 \times 10^{-5}$ J
  internal circuit: $6.28 \times 10^{-7}$ J

TABLE 7

Energy absorbing limit of:
  protective element alone: $1.07 \times 10^{-5}$ J
  internal circuit alone: $1.44 \times 10^{-6}$ J As shown in Tables 6 and 7, the energy ($6.28 \times 10^{-7}$ joules) distributed to the internal circuit is smaller than that ($1.61 \times 10^{-6}$ joules) of Table 3 and also smaller than the energy absorbing limit ($1.44 \times 10^{-6}$ joules) of the internal circuit alone. Namely, the internal circuit is protected by the protective element and not broken. On the other hand, the energy ($1.16 \times 10^{-2}$ joules) distributed to the protective element is larger than the energy absorbing limit ($1.07 \times 10^{-5}$ joules) of the protective element alone. This means that the protective element itself is broken when receiving energy of a level equal to its energy absorbing limit corresponding to the withstand voltage 470 V. Namely, the breakdown point of the protective element is equal to the breakdown point of the internal circuit provided with the protective element.

As explained above, although the new type of protective element has a lower energy absorbing limit than that of the type 1 protective element, the new type has a lower operating voltage and a lower resistance R. As a result, the new type fully protects the internal circuit. As mentioned above, the withstand voltage 510 V of the internal circuit provided with the new type of protective element is higher than the withstand voltage 470 V of the internal circuit provided with the type 1 protective element.

In this way, the method of the invention easily designs a protective element optimum for a given internal circuit.

Figure 6:
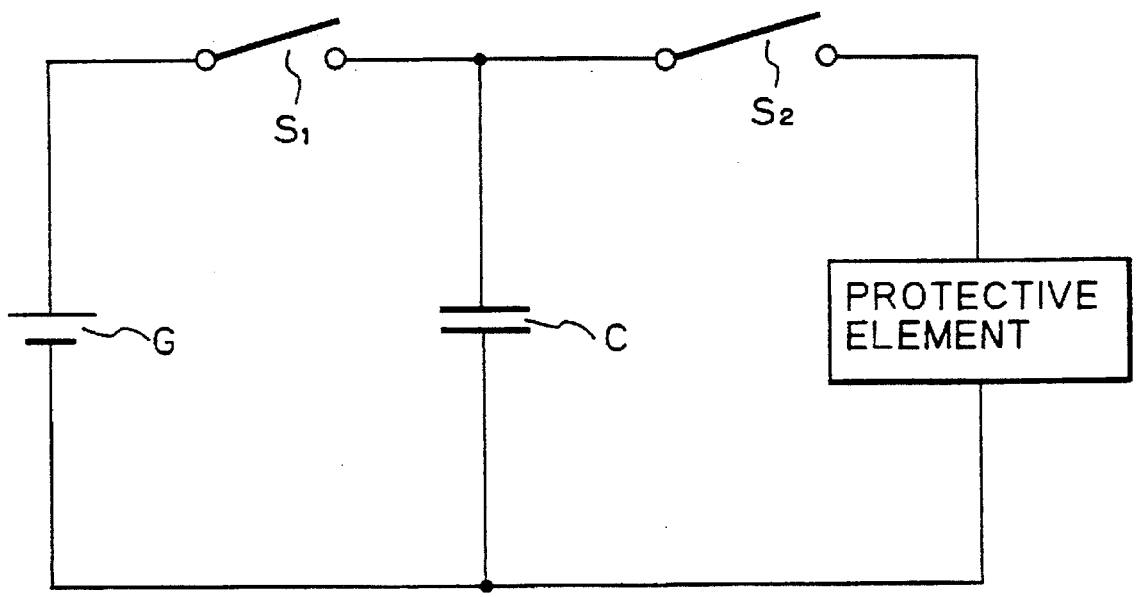
FIG. 6 is a circuit diagram showing a test circuit for testing a protective element.

FIG. 6 shows a tester for testing a protective element. The C-B short-circuited protective element of FIG. 4(a) having a saturation resistance of, for example, 8 ohms is connected to the tester of FIG. 6. In the tester, a power source G applies a voltage to across the opposite ends of a capacitor C through a first switch S1, and the capacitor C applies a voltage to two terminals of the protective element 14 through a second switch S2. The two switches S1 and S2 are not simultaneously closed.

The capacitance of the capacitor C is, for example, 200 pF. The first switch S1 is closed to apply a voltage of 600 V of the power source G to the capacitor C to accumulate charges therein. Thereafter, the first switch S1 is opened, and then the second switch S2 is closed to apply an energy of $3.6 \times 10^{-5}$ J to the protective element 14.

If the resistance element 52 of FIG. 4(a) has a resistance of 4 ohms, a total discharge resistance will be 12 ohms. By ignoring electrostatic energy entering the internal circuit 2, a voltage to be applied to the resistance element 52 will be 200 V, and the energy absorbed by the internal circuit is one third(i.e., ⅓) of the total, i.e., $1.2 \times 10^{-5}$ J. On the other hand, a voltage applied to the $n^+$-type diffusion layer 11a is 400 V, so that a current flowing to the protective diode 14 is reduced. In addition, due to a time constant, a discharge time becomes longer thereby to prevent a breakdown of the protective element 14 due to a concentration of a steep discharge current.

As a result, the withstand voltage of a combination of the protective element 14 and resistance element 52 becomes about 700 V.

As explained above, the withstand voltage of the internal circuit is first examined, and the resistance element 52 appropriate for the withstand voltage is selected and connected to the protective element 14.

As shown in FIG. 4(c), five resistors, each of 20 ohms, may be connected in parallel. In this case, the energy absorbed by each of the resistors will be $2.4 \times 10^{-6}$, thereby reducing the load of each resistor.

Figure 5A:
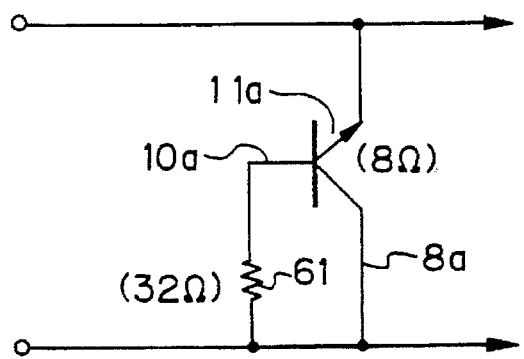
FIGS. 5(a) to 5(d) are equivalent circuit schematics of modifications of the fourth embodiment.
Figure 5B:
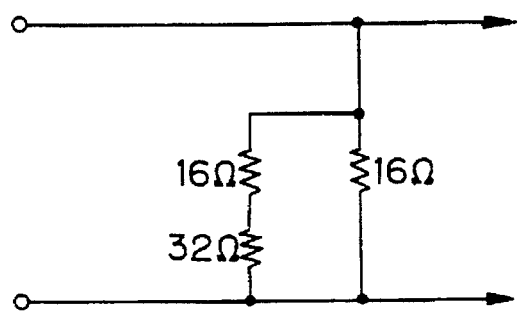

As shown in FIG. 5(a), a resistance element 61 may be connected to the $p^+$-type diffusion layer 10a to adjust the withstand voltage. If the value of the resistance element is 32 ohms, the protective unit as a whole provides a resistance of 12 ohms as shown in FIG. 5(b).

Figure 5C:
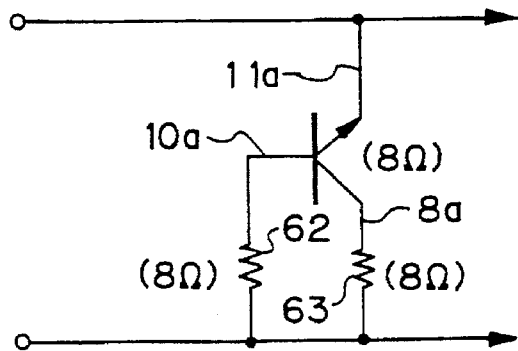
Figure 5D:
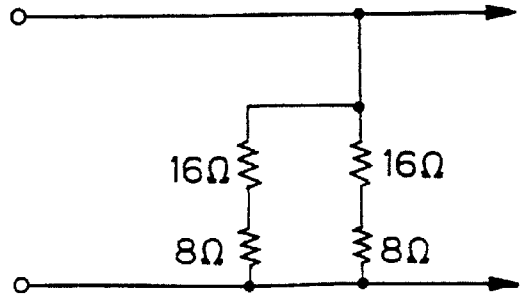

As shown in FIG. 5(c), resistance elements 62 and 63 may be connected to the silicon layer 8a and $p^+$-type diffusion layer 10a, to distribute the absorbed energy to the two resistor elements. If the resistance of each of the resistance elements is 8 ohms, 12 ohms is obtained as a whole as shown in FIG. 5(d).

According to the fourth embodiment, the depth of each diffusion layer of the protective element is the same as that of the prior art, and a resistance element is connected to the protective element. It is also possible to connect a resistance element to the protective diode of any of the first to third embodiments, to adjust the withstand voltage and breakdown voltage of the protective element.

As explained above, according to an aspect of the invention, a second-conduction-type diffusion layer of a protective diode is deeper than an emitter diffusion layer of a bipolar transistor of an internal circuit protected by the protective element, so that the side face of the diffusion layer of the protective element is increased, thereby to reduce a current density on the side face, thereby increasing the withstand voltage of the protective element.

According to another aspect of the invention, a second-conduction-type diffusion layer of a C-B short-circuited protective element is deepened to reduce a current density on the side face of the protective element. In addition, a distance between the bottom of the second-conduction-type diffusion layer and the bottom of a first-conduction-type diffusion layer of the protective element is made short, to thereby reduce the width of a base of an inverse bipolar transistor formed under the second-conduction-type diffusion layer. As a result, the current amplification factor of the inverse bipolar transistor is increased, thereby to increase a vertically flowing current and thereby reducing a concentration of current on the side face of the protective element.

According to still another aspect of the invention, a resistance element is connected to at least one of the second-conduction-type semiconductor layer, the first-conduction-type diffusion layer and the second-conduction-type diffusion layer of a C-B short-circuited protective element so that, due to a time constant, a temporary concentration of discharged current flowing through the protective element is relaxed (i.e., reduced), and a current flowing through the protective element is reduced to increase the withstand voltage of the protective element.

According to still another aspect of the invention, a part of the bottom of a first-conduction-type diffusion layer of a C-B short-circuited protective element is made to be close to a second-conduction-type diffusion layer of the protective element, so that the amplification factor of an inverse bipolar transistor is increased, thereby to reduce a discharged current flowing through the side face of the second-conduction-type diffusion layer as well as reducing a current density on the side face.

According to still another aspect of the invention, the first-conduction-type diffusion layer and second-conduction-type diffusion layer of a C-B short-circuited protective element are both increased in depth, so that a distance between the first-conduction-type diffusion layer and a buried layer connected to the first-conduction-type diffusion layer is reduced, thereby to reduce the collector resistance of an inverse vertical bipolar transistor and thereby increasing the amplification factor of the transistor. In this case, the second-conduction-type diffusion layer is also deepened to enlarge the side face thereof, to thereby reduce a current density on the side face.

According to still another aspect of the invention, a resistance element is connected to at least one of the second-conduction-type semiconductor layer, the first-conduction-type diffusion layer, and the second-conduction-type diffusion layer of a C-B short-circuited protective element so that, even if the first-conduction-type diffusion layer and second-conduction-type diffusion layer have conventional structures, a temporary concentration of discharged current flowing through the protective element can be relaxed (i.e., reduced) due to a time constant, thereby increasing the withstand voltage of the protective element. In addition, a current flowing through the protective element is reduced, thereby to further increase the withstand voltage of the protective element.

We claim:

1. A semiconductor device having an internal circuit and a protective element, comprising:
    a semiconductor substrate, of a first conductivity type, having an upper main surface;
    a semiconductor layer, of a second conductivity type opposite to the first conductivity type, formed on the upper main surface of the semiconductor substrate and defining an interface therebetween, and having an upper main surface;
    the internal circuit comprising a vertical bipolar transistor formed in a corresponding, first region of the semiconductor layer and having an emitter diffusion layer which extends into the semiconductor layer from the upper main surface thereof and into the first region to a first depth therewithin;
    the protective element being formed in a corresponding second region of the semiconductor layer, displaced from and electrically isolated from the first region thereof in which the internal circuit is formed, and comprising:
        a first diffusion layer of the first conductivity type which extends into the semiconductor layer, from the upper main surface thereof and within the corresponding second region, to a second depth therewithin, and
        a second diffusion layer of the second conductivity type, formed in the first diffusion layer and extending from the upper main surface of the semiconductor layer into the first diffusion layer to a depth less than the second depth, at least a part thereof extending to a third depth which is greater than the first depth;
    first and second buried, diffused regions formed on the upper main surface of the substrate at respective first and second portions of the interface thereof with, and corresponding to, the first and second regions of the semiconductor layer in which the internal circuit and the protective element, respectively, are formed;
    an isolation region of the first conductivity type extending from the upper main surface of the semiconductor layer to the upper main surface of the substrate and disposed between, and thereby electrically isolating, the first and second regions of the semiconductor layer;
    a doped region of the second conductivity type extending from the upper main surface of the semiconductor layer and within the second region to the second buried diffusion layer;
    respective electrodes connected to the doped region of the second conductivity type and to the first and second diffusion layers, at the respective surfaces thereof exposed at the upper main surface of the semiconductor layer within the second region;
    an electrical interconnection between the respective electrodes connected to, and electrically short-circuiting, the doped region of the second conductivity type and the first diffusion layer;
    a terminal; and
    a resistance element having first and second ends and electrically connected at the first end to at least one of the second region of the semiconductor layer, the first diffusion layer and the second diffusion layer of the protective element and at the second end to the terminal.

2. A semiconductor device having an internal circuit and a protective element, comprising:
    a semiconductor substrate, of a first conductivity type, having an upper main surface;
    a semiconductor layer, of a second conductivity type opposite to the first conductivity type, formed on the upper main surface of the semiconductor substrate and defining an interface therebetween, and having an upper main surface;
    the internal circuit comprising a vertical bipolar transistor formed in a corresponding, first region of the semiconductor layer and having an emitter diffusion layer which extends into the semiconductor layer from the upper main surface thereof and into the first region to a first depth therewithin;

the protective element being formed in a corresponding second region of the semiconductor layer, displaced from and electrically isolated from the first region thereof in which the internal circuit is formed, and comprising:
  a first diffusion layer of the first conductivity type which extends into the semiconductor layer, from the upper main surface thereof and within the corresponding second region, to a second depth therewithin,
  a second diffusion layer of the second conductivity type, formed in the first diffusion layer and extending from the upper main surface of the semiconductor layer into the first diffusion layer to a uniform third depth, less than the second depth and greater than the first depth, and defining a planar bottom surface and corresponding interface with the first diffusion layer, and
  the first diffusion layer extends to a uniform, second depth, defining a planar bottom surface and corresponding interface with the second semiconductor region, parallel to the interface between the second semiconductor region and the upper main surface of the substrate;
first and second buried, diffused regions formed on the upper main surface of the substrate at respective first and second portions of the interface thereof with, and corresponding to, the first and second regions of the semiconductor layer in which the internal circuit and the protective element, respectively, are formed;
an isolation region of the first conductivity type extending from the upper main surface of the semiconductor layer to the upper main surface of the substrate and disposed between, and thereby electrically isolating, the first and second regions of the semiconductor layer;
a doped region of the second conductivity type extending from the upper main surface of the semiconductor layer and within the second region to the second buried diffusion layer;
respective electrodes connected to the doped region of the second conductivity type and to the first and second diffusion layers, at the respective surfaces thereof exposed at the upper main surface of the semiconductor layer within the second region; and
an electrical interconnection between the respective electrodes connected to, and electrically short-circuiting, the doped region of the second conductivity type and the first diffusion layer.

3. A semiconductor device having an internal circuit and a protective element, comprising:
  a semiconductor substrate, of a first conductivity type, having an upper main surface;
  a semiconductor layer, of a second conductivity type opposite to the first conductivity type, formed on the upper main surface of the semiconductor substrate and defining an interface therebetween, and having an upper main surface;
  the internal circuit comprising a vertical bipolar transistor formed in a corresponding, first region of the semiconductor layer and having an emitter diffusion layer which extends into the semiconductor layer from the upper main surface thereof and into the first region to a first depth therewithin;
  the protective element being formed in a corresponding second region of the semiconductor layer, displaced from and electrically isolated from the first region thereof in which the internal circuit is formed, and comprising:
    a first diffusion layer of the first conductivity type which extends into the semiconductor layer, from the upper main surface thereof and within the corresponding second region, to a second depth therewithin, and
    a second diffusion layer of the second conductivity type, formed in the first diffusion layer and extending from the upper main surface of the semiconductor layer into the first diffusion layer to a uniform third depth, less than the second depth and greater than the first depth, and defining a planar bottom surface and corresponding interface with the first diffusion layer, and
    the first diffusion layer includes a first portion extending to the second depth and a second portion extending to a fourth depth less than the second depth but greater than the third depth, the first and second portions defining respective first and second planar bottom surfaces and corresponding interfaces, at the corresponding second and fourth depths, with the first diffusion layer and at least a part of the second planar bottom surface, of the fourth depth, is in aligned and opposed relationship with the planar bottom surface, of the third depth, of the second diffusion layer;
  first and second buried, diffused regions formed on the upper main surface of the substrate at respective first and second portions of the interface thereof with, and corresponding to, the first and second regions of the semiconductor layer in which the internal circuit and the protective element, respectively, are formed;
  an isolation region of the first conductivity type extending from the upper main surface of the semiconductor layer to the upper main surface of the substrate and disposed between, and thereby electrically isolating, the first and second regions of the semiconductor layer;
  a doped region of the second conductivity type extending from the upper main surface of the semiconductor layer and within the second region to the second buried diffusion layer;
  respective electrodes connected to the doped region of the second conductivity type and to the first and second diffusion layers, at the respective surfaces thereof exposed at the upper main surface of the semiconductor layer within the second region;
  an electrical interconnection between the respective electrodes connected to, and electrically short-circuiting, the doped region of the second conductivity type and the first diffusion layer.

4. A semiconductor device having an internal circuit and a protective element, comprising:
  a semiconductor substrate, of a first conductivity type, having an upper main surface;
  a semiconductor layer, of a second conductivity type opposite to the first conductivity type, formed on the upper main surface of the semiconductor substrate and defining an interface therebetween, and having an upper main surface;
  the internal circuit comprising a vertical bipolar transistor formed in a corresponding, first region of the semiconductor layer and having an emitter diffusion layer which extends into the semiconductor layer from the upper main surface thereof and into the first region to a first depth therewithin;
  the protective element being formed in a corresponding second region of the semiconductor layer, displaced from and electrically isolated from the first region thereof in which the internal circuit is formed, and comprising:
  a first diffusion layer of the first conductivity type which extends into the semiconductor layer, from the upper main surface thereof and within the corresponding second region, to a second depth therewithin, and
  a second diffusion layer of the second conductivity type, formed in the first diffusion layer and extending from the upper main surface of the semiconductor layer into the first diffusion layer to a depth and which includes a first portion extending to a third depth, greater than the first depth, and a second portion extending to a fourth depth, greater than the third depth but smaller than the second depth, the first and second portions defining respective first and second planar bottom surfaces and corresponding interfaces, at the corresponding third and fourth depths, with the first diffusion layer; and
  the first diffusion layer extends to a uniform second depth and defines a planar bottom surface and corresponding interface thereof, at the second depth, with the second semiconductor region in parallel with the interface between the second semiconductor region and the upper main surface of the substrate, at least a part of the planar bottom surface thereof, of the second depth being in aligned and opposed relationship with the planar bottom surface, of the fourth depth, of the second diffusion layer;
first and second buried, diffused regions formed on the upper main surface of the substrate at respective first and second portions of the interface thereof with, and corresponding to, the first and second regions of the semiconductor layer in which the internal circuit and the protective element, respectively, are formed;
an isolation region of the first conductivity type extending from the upper main surface of the semiconductor layer to the upper main surface of the substrate and disposed between, and thereby electrically isolating, the first and second regions of the semiconductor layer;
a doped region of the second conductivity type extending from the upper main surface of the semiconductor layer and within the second region to the second buried diffusion layer;
respective electrodes connected to the doped region of the second conductivity type and to the first and second diffusion layers, at the respective surfaces thereof exposed at the upper main surface of the semiconductor layer within the second region;
an electrical interconnection between the respective electrodes connected to, and electrically short-circuiting, the doped region of the second conductivity type and the first diffusion layer.

5. A semiconductor device having an internal circuit and a protective element, comprising:
  a semiconductor substrate, of a first conductivity type, having an upper main surface;
  a semiconductor layer, of a second conductivity type opposite to the first conductivity type, formed on the upper main surface of the semiconductor substrate and having an upper main surface and defining an interface therebetween;
  the internal circuit comprising a vertical bipolar transistor formed in a corresponding, first region of the semiconductor layer and having a base diffusion layer which extends into the semiconductor layer from the upper main surface thereof and within the first region to a first depth therewithin and an emitter diffusion layer which extends into the semiconductor layer from the upper main surface thereof and within the base diffusion layer to a second depth therewithin;
  the protective element being formed in a corresponding second region of the semiconductor layer, displaced from and electrically isolated from the first region thereof in which the internal circuit is formed, and comprising:
    a first diffusion layer of the first conductivity type which extends into the semiconductor layer and within the corresponding second region, from the upper main surface thereof to a third depth therewithin, and
    a second diffusion layer of the second conductivity type, formed in the first diffusion layer and extending from the upper main surface of the semiconductor layer and into the first diffusion layer to a depth less than the third depth, at least a part thereof extending to a fourth depth which is greater than the second depth, the first and third depths being substantially equal and the fourth depth being greater than the second depth; and
  first and second buried, diffused regions formed on the upper main surface of the substrate at respective first and second portions of the interface thereof with, and corresponding to, the first and second regions of the semiconductor layer in which the internal circuit and the protective element, respectively, are formed.

6. A semiconductor device as recited in claim 5, further comprising:
  a doped region of the second conductivity type extending from the upper main surface of the semiconductor layer and within the second region to the second buried diffusion layer;
  respective electrodes connected to the doped region of the second conductivity type and to the first and second diffusion layers, at the respective surfaces thereof exposed at the upper main surface of the semiconductor layer within the second region; and
  an electrical interconnection between the respective electrodes connected to, and electrically short-circuiting, the doped region of the second conductivity type and the first diffusion layer.

7. A semiconductor device having internal circuit and a protective element comprising:
  a semiconductor substrate, of a first conductivity type, having an upper main surface;
  a semiconductor layer, of a second conductivity type opposite to the first conductivity type, formed on the upper main surface of the semiconductor substrate and having an upper main surface and defining an interface therebetween;
  the internal circuit comprising a vertical bipolar transistor formed in a corresponding, first region of the semiconductor layer and having a base diffusion layer which extends into the semiconductor layer from the upper main surface thereof to a first depth therewithin and an emitter diffusion layer which extends into the semiconductor layer from the upper main surface thereof and within the base diffusion layer to a second depth therewithin;
  the protective element being formed in a corresponding second region of the semiconductor layer, displaced from and electrically isolated from the first region thereof in which the internal circuit is formed, and comprising:
- a first diffusion layer of the first conductivity type which extends into the semiconductor layer, within the corresponding second region, from the upper main surface thereof to a third depth therewithin, and
- a second diffusion layer of the second conductivity type, formed in the first diffusion layer and extending from the upper main surface of the semiconductor layer into the first diffusion layer to a depth less than the second depth, at least a part thereof extending to a fourth depth which is greater than the first depth, the third depth being greater than the first depth and the fourth depth being greater than the second depth;
- first and second buried, diffused regions formed on the upper main surface of the substrate at respective first and second portions of the interface thereof with, and corresponding to, the first and second regions of the semiconductor layer in which the internal circuit and the protective element, respectively, are formed.

8. A semiconductor device as recited in claim 7, wherein the difference between the first and second depths is greater than the difference between the third and fourth depths.

9. A semiconductor device as recited in claim 8, further comprising:
- a doped region of the second conductivity type extending from the upper main surface of the semiconductor layer and within the second region to the second buried diffusion layer;
- respective electrodes connected to the doped region of the second conductivity type and to the first and second diffusion layers, at the respective surfaces thereof exposed at the upper main surface of the semiconductor layer within the second region; and
- an electrical interconnection between the respective electrodes connected to, and electrically short-circuiting the doped region of the second conductivity type and the first diffusion layer.

10. A semiconductor device having an internal circuit and a protective element and a terminal, comprising:
- a semiconductor substrate, of a first conductivity type, having an upper main surface;
- a semiconductor layer, of a second conductivity type opposite to the first conductivity type, formed on the upper main surface of the semiconductor substrate and defining an interface therebetween, and having an upper main surface;
- the internal circuit comprising a vertical bipolar transistor formed in a corresponding, first region of the semiconductor layer and having an emitter diffusion layer which extends into the semiconductor layer from the upper main surface thereof and into the first region to a first depth therewithin;
- the protective element being formed in a corresponding second region of the semiconductor layer, displaced from and electrically isolated from the first region thereof in which the internal circuit is formed, and comprising:
  - a first diffusion layer of the first conductivity type which extends into the semiconductor layer, from the upper main surface thereof and within the corresponding second region, to a second depth therewithin, and
  - a second diffusion layer of the second conductivity type, formed in the first diffusion layer and extending from the upper main surface of the semiconductor layer into the first diffusion layer to a depth less than the second depth, at least a part thereof extending to a third depth which is greater than the first depth;
- first and second buried, diffused regions formed on the upper main surface of the substrate at respective first and second portions of the interface thereof with, and corresponding to, the first and second regions of the semiconductor layer in which the internal circuit and the protective element, respectively, are formed;
- a resistance element having first and second ends and electrically connected at the first end to at least one of the second region of the semiconductor layer, the first diffusion layer and the second diffusion layer of the protective element and at the second end to the terminal;
- a doped region of the second conductivity type extending from the upper main surface of the semiconductor layer and within the second region to the second buried diffusion layer;
- respective electrodes connected to the doped region of the second conductivity type and to the first and second diffusion layers, at the respective surfaces thereof exposed at the upper main surface of the semiconductor layer within the second region; and
- an electrical interconnection between the respective electrodes connected to, and electrically short-circuiting, the doped region of the second conductivity type and the first diffusion layer.

11. A semiconductor device having an internal circuit and a protective element, comprising:
- a semiconductor substrate, of a first conductivity type, having an upper main surface;
- a semiconductor layer, of a second conductivity type opposite to the first conductivity type, formed on the upper main surface of the semiconductor substrate and defining an interface therebetween, and having an upper main surface;
- a first region and a second region formed in the semiconductor layer and electrically isolated from each other;
- the first and second regions being provided, respectively, with first and second diffusion layers commonly of the first conductivity type, each of the first and second diffusion layers extending into the semiconductor layer from the upper main surface thereof and to a first depth therewithin;
- the internal circuit comprising a vertical bipolar transistor, formed in the first diffusion layer and having an emitter diffusion layer which extends into the first diffusion layer from the upper main surface thereof to a second depth therewithin;
- the protective element being formed in the second diffusion layer and having an emitter diffusion layer which extends into the second diffusion layer from the upper main surface thereof to a third depth therewithin, less than the first depth but greater than said second depth;
- first and second buried, diffused regions formed on the upper main surface of the substrate at respective first and second portions of the interface thereof with, and corresponding to, the first and second regions of the semiconductor layer in which the internal circuit and the protective element, respectively, are formed;
- first and second diffused collector leads exposed at, and extending from, the upper main surface of the semiconductor layer to the first and second buried diffused regions, respectively, and thereby providing electrical connections thereto from the upper main surface of the semiconductor layer;

the second diffusion layer extending to a uniform third depth defining a planar bottom surface and corresponding interface with the first diffusion layer; and the first diffusion layer including a first portion extending to the second depth and a second portion extending to a fourth depth less than the second depth but greater than the third depth, the first and second portions defining respective first and second planar bottom surfaces and corresponding interfaces, at the corresponding second and fourth depths, with the first diffusion layer and at least a part of the second planar bottom surface, of the fourth depth, in aligned and opposed relationship with the planar bottom surface, of the third depth, of the second diffusion layer.

12. A semiconductor device having an internal circuit and a protective element, comprising:

a semiconductor substrate, of a first conductivity type, having an upper main surface;

a semiconductor layer, of a second conductivity type opposite to the first conductivity type, formed on the upper main surface of the semiconductor substrate and defining an interface therebetween, and having an upper main surface;

a first region and a second region formed in the semiconductor layer and electrically isolated from each other;

the first and second regions being provided, respectively, with first and second diffusion layers commonly of the first conductivity type, each of the first and second diffusion layers extending into the semiconductor layer from the upper main surface thereof and to a first depth therewithin;

the internal circuit comprising a vertical bipolar transistor, formed in the first diffusion layer and having an emitter diffusion layer which extends into the first diffusion layer from the upper main surface thereof to a second depth therewithin;

the protective element being formed in the second diffusion layer and having an emitter diffusion layer which extends into the second diffusion layer from the upper main surface thereof to a third depth therewithin, less than the first depth but greater than said second depth;

first and second buried, diffused regions formed on the upper main surface of the substrate at respective first and second portions of the interface thereof with, and corresponding to, the first and second regions of the semiconductor layer in which the internal circuit and the protective element, respectively, are formed;

first and second diffused collector leads exposed at, and extending from, the upper main surface of the semiconductor layer to the first and second buried diffused regions, respectively, and thereby providing electrical connections thereto from the upper main surface of the semiconductor layer;

the second diffusion layer including a first portion extending to the third depth and a second portion extending to a fourth depth, greater than the third depth but smaller than the second depth, the first and second portions defining respective first and second planar bottom surfaces and corresponding interfaces, at the corresponding third and fourth depths, with the first diffusion layer; and the first diffusion layer extending to a uniform second depth and defining a planar bottom surface and corresponding interface thereof, at the second depth, with the second semiconductor region in parallel with the interface between the second semiconductor region and the upper main surface of the substrate, at least a part of the planar bottom surface thereof, of the second depth, being in aligned and opposed relationship with the planar bottom surface, of the fourth depth, of the second diffusion layer.

* * * * *

UNITED STATES PATENT AND TRADEMARK OFFICE
CERTIFICATE OF CORRECTION

PATENT NO. : 5,648,676
DATED : July 15, 1997
INVENTOR(S) : IWAI et al.

It is certified that error appears in the above-identified patent and that said Letters Patent is hereby corrected as shown below:   On the title page:

TITLE PAGE: [75] Inventors, line 1, change "Hachioji" to --Tokyo--.

Col. 4,  line 49, after "curves" insert --of C-B,--.

Col. 5,  line 36, after "reduced" insert --,--; and after "to" insert --further--.
         line 52, after "layer" insert --21a--.

Col. 6,  line 12, change "FIG. 11(a)" to --FIG. 1(a)--.

Col. 7,  line 10, after "down" insert --,--.
         line 60, change "D" to --$\beta$--.

Col. 8,  line 9, change "parts" to --part 30a--;
         line 10, delete "30a".

Col. 13, line 30, change "thereof and, the" to --thereof, and the respective--.

Col. 16, line 2, after "element" insert --which is--;
         line 7, delete "to".

Signed and Sealed this

Sixth Day of January, 1998

Attest:

BRUCE LEHMAN

*Attesting Officer*          *Commissioner of Patents and Trademarks*